(12) United States Patent
Barthel

(10) Patent No.: US 11,119,144 B2
(45) Date of Patent: Sep. 14, 2021

(54) METHOD FOR PERFORMING A BODE MEASUREMENT AS WELL AS MEASUREMENT SETUP

(71) Applicant: Rohde & Schwarz GmbH & Co. KG, Munich (DE)

(72) Inventor: Sven Barthel, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 265 days.

(21) Appl. No.: 16/295,888

(22) Filed: Mar. 7, 2019

(65) Prior Publication Data

US 2020/0284832 A1 Sep. 10, 2020

(51) Int. Cl.
*G01R 31/28* (2006.01)

(52) U.S. Cl.
CPC .................. *G01R 31/2837* (2013.01)

(58) Field of Classification Search
CPC ................. G01R 31/2837; G01R 31/2841
See application file for complete search history.

(56) References Cited

U.S. PATENT DOCUMENTS

| | | | | |
|---|---|---|---|---|
| 7,576,606 B2* | 8/2009 | Andersen | ................ | H03F 3/217 330/10 |
| 10,746,630 B2* | 8/2020 | Jalali | .................. | G06K 9/00536 |
| 2010/0237851 A1* | 9/2010 | Coster | .................... | G01R 27/02 324/76.19 |
| 2014/0281595 A1* | 9/2014 | Baker | ................. | G06F 11/2273 713/300 |
| 2016/0018466 A1* | 1/2016 | Miklosovic | ............. | H02P 23/14 702/182 |
| 2017/0016953 A1* | 1/2017 | Beer | ...................... | G01R 27/28 |

OTHER PUBLICATIONS

Datatec , Power Supply Control Loop Response (Bode Plot) Measurements (Year: 2106).*

* cited by examiner

*Primary Examiner* — Mohammad K Islam
(74) *Attorney, Agent, or Firm* — Christensen O'Connor Johnson Kindness PLLC

(57) ABSTRACT

A method for performing a Bode measurement on a device under test having a specified working input range and a specified working output range using a measurement system comprising: receiving at least one input boundary parameter of the working input range and at least one output boundary parameter of the output working range; generating a first stimulus signal using a stimulus signal generator of the measurement system based on the at least one input boundary parameter; feeding the first stimulus signal to an input of the device under test; and measuring an output signal of the device under test using a measurement unit of the measurement system in a measurement range based on the at least one output boundary parameter obtaining a measurement result. Further, a measurement setup is shown.

17 Claims, 2 Drawing Sheets

METHOD FOR PERFORMING A BODE MEASUREMENT AS WELL AS MEASUREMENT SETUP

FIELD OF THE DISCLOSURE

The disclosure concerns a method for performing a Bode measurement on a device under test and a measurement setup for performing Bode measurements.

BACKGROUND

Bode measurements are an essential part of testing a device to be used in a network. However, the quality of the result strongly depends on the stimulus signal fed to the device under test for performing the measurement. Determining the correct stimulus signal is a tedious task, as clipping may occur at the input and the output of the device under test even when a stimulus signal within the specified voltage range of the device under test is used.

Thus, there is a need for improving the stimulus signal for performing Bode measurements on a device under test.

SUMMARY

For this purpose or others, a method for performing a Bode measurement on a device under test having a specified working input range and a specified working output range using a measurement system is provided. The method in some embodiments comprises the following steps:

receiving at least one input boundary parameter of the working input range and at least one output boundary parameter of the output working range;

generating a first stimulus signal using a stimulus signal generator of the measurement system based on the at least one input boundary parameter;

feeding the first stimulus signal to an input of the device under test; and measuring an output signal of the device under test using a measurement unit of the measurement system in a measurement range based on the at least one output boundary parameter obtaining a measurement result.

By generating a stimulus signal within the working range of the device under test and measuring the output signal of the device under test within the working output range of the device under test, it can be securely determined if the stimulus signal used is suitable for performing Bode measurements.

In some embodiments, the measurement system receives the input boundary parameters.

In an embodiment of the disclosure, the upper boundary of the working input range and the lower boundary of the working input range are received as the at least one input boundary parameter and that the first stimulus signal is generated to be between the upper boundary and the lower boundary of the working input range in order to avoid damage to the device under test.

In some embodiments, the first stimulus signal lies fully between the upper boundary and the lower boundary of the working input range.

For example, the upper boundary and/or the lower boundary in some embodiments is in the magnitude of millivolts.

In an aspect of the disclosure, the upper boundary of the working output range and the lower boundary of the working output range are received as the at least one output boundary parameter and that the output signal is measured between the upper boundary and the lower boundary of the working output range. This way, unspecified output signals are ignored.

In some embodiments, the output signal is measured, e.g., recorded, only between the upper boundary and the lower boundary of the working output range.

For example, the upper boundary and/or the lower boundary in some embodiments is in the magnitude of volts.

In an embodiment, the measurement unit determines whether the output signal is clipped in order to reliably determine unsuitable stimulus signals. In some embodiments, the information whether clipping has occurred may be part of a measurement result.

For a compact measurement system, the measurement system comprises an oscilloscope having the measurement unit and/or the stimulus signal generator.

In some embodiments, the device under test is an active device or a passive device allowing flexible application of the method generally described above.

In a further embodiment, a new stimulus signal is determined based on the measurement result. This way, the stimulus signal is improved.

For example, the signal level of the new stimulus signal is, e.g., reduced compared to the signal level of the first stimulus signal and/or the previously used stimulus signal if it has been determined that the output signal is clipped in order to avoid clipping and increasing measurement accuracy.

In an aspect, the signal level of the new stimulus signal is, e.g., increased compared to the signal level of the first stimulus signal and/or the previously used stimulus signal if it has been determined that the output signal is not clipped and does not extend over a predetermined portion of the measurement range. This way, the full dynamic range of the device under test may be measured.

For improved results, a new output signal of the device under test is measured using the new stimulus signal obtaining a new measurement result.

In an embodiment, a Bode diagram of the device under test is determined based on the new measurement result so that a precise Bode measurement is carried out.

For precise measurement of the transfer function, the transfer function of the device under test is determined based on the new measurement result.

For above purpose or others, a measurement setup for performing a Bode measurement is provided. The measurement setup comprises, e.g., a device under test having a specified working input range and a specified working output range, and a measurement system having a stimulus signal generator and a measurement unit. The stimulus signal generator is connected to an input of the device under test and an output of the device under test is connected to the measurement unit. The measurement system in some embodiments is configured to:

receive at least one input boundary parameter of the working input range and at least one output boundary parameter of the output working range;

generate a first stimulus signal based on the at least one input boundary parameter using the stimulus signal generator; and measure an output signal of the device under test using the measurement unit of the measurement system in a measurement range based on the at least one output boundary parameter obtaining a measurement result.

The features and advantages of the method also apply to the measurement setup and vice versa.

The device under test may comprise an active component and/or a passive component so that the measurement system may be used for testing a broad range of devices. In some non-limiting examples, the device under test comprises an amplifier, an operational amplifier, a quartz filter, a z-diode, a voltage divider and/or a resistor.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
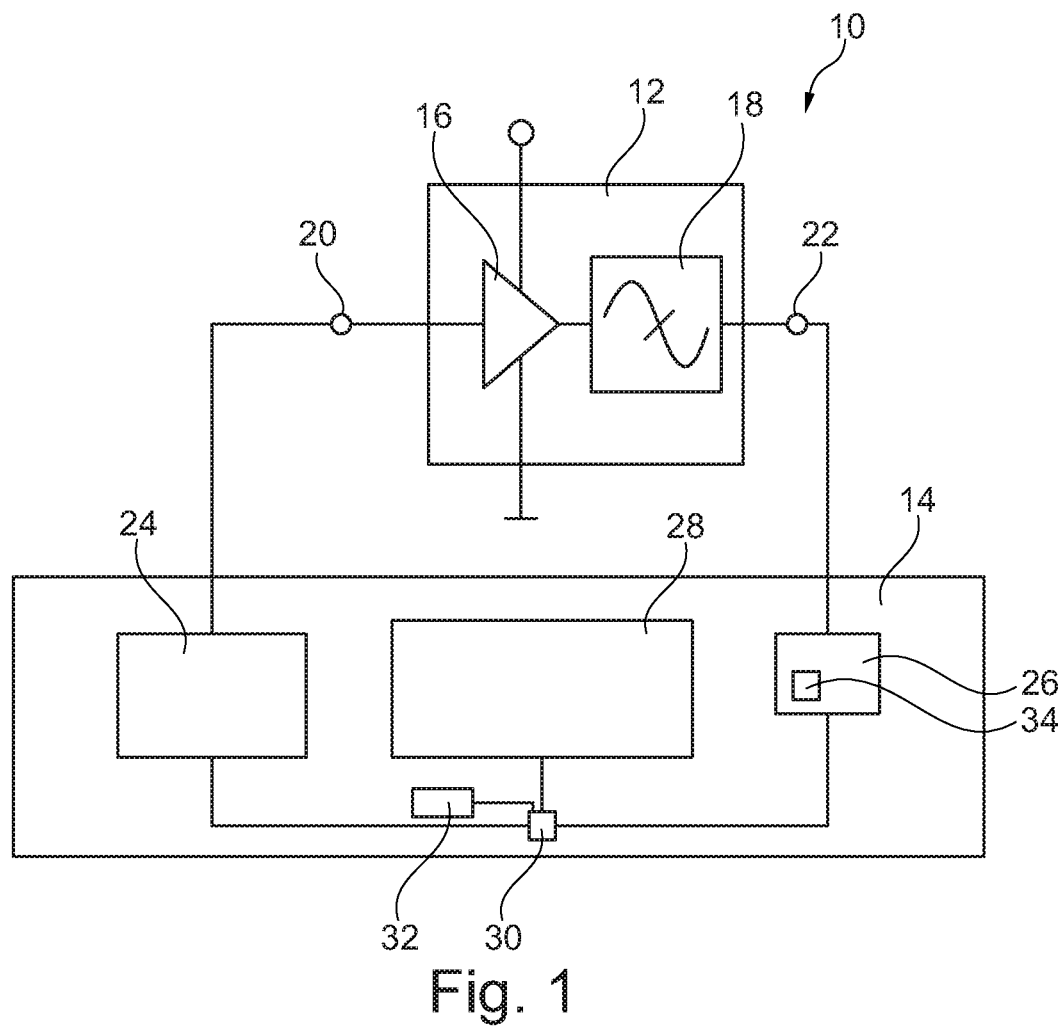
FIG. 1 shows schematically a representative embodiment of a measurement setup according to the disclosure.

FIG. 1 shows schematically a representative embodiment of a measurement setup 10 for performing Bode measurements on a device under test 12. As shown in FIG. 1, the measurement setup 10 comprises the device under test (DUT) 12 and a measurement system 14. The device under test 12 may be an active device or a passive device and thus comprises active components and/or passive components. In some non-limiting examples, the device under test 12 comprises, for example, an amplifier, an operational amplifier, a quartz filter, a z-diode, a voltage divider and/or a resistor.

In the embodiment shown in FIG. 1, the device under test 12 comprises an operational amplifier 16 and a filter 18 as well as an input 20 connected to the operational amplifier 16 and an output 22 connected to the filter 18. The device under test 12 has a specified working input range, i.e. the device under test 12 is designed to work with voltages applied at the input 20 within the specified working input range.

The working input range is bounded by an upper boundary and a lower boundary that may be in the magnitude of millivolts. For example, in some embodiments the upper boundary is 0.1 V and the lower boundary is −0.1 V leading to a working input range of −0.1 V to +0.1 V. Of course, the working input range may comprise other voltage ranges as well.

Likewise, the output 22 of the device under test 12 has a specified working output range, i.e. a voltage range in which the output signal of the device under test 12 lies during the use of the device under test 12. The working output range is also bounded by an upper boundary and a lower boundary, both of which may lie, for example, in the magnitude of volts. For example, the lower boundary is 1 V and the upper boundary is 4 V yielding a working output range of 1 V to 4 V. Of course, the working output range may comprise other voltage ranges as well.

Referencing again FIG. 1, the measurement setup 10 includes the measurement system 14. In some embodiments, the measurement setup 10 comprises a stimulus signal generator 24, a measurement unit 26, a display unit 28 and a control unit 30. The measurement system 14 is, for example, an oscilloscope.

The control unit 30 is connected to the stimulus signal generator 24, the measurement unit 26 and the display unit 28 to control the respective units. The control unit 30 may be implemented in software or in hardware or in a combination of hardware and software to carry out the functionality described herein. In one embodiment, the control unit 30 includes a programmed microprocessor or other specially configured computing device.

The display unit 28 may be designed as a touch screen so that the display unit 28 may serve as an input and output interface with the user. Alternatively or in addition, the measurement system 14 may also comprise input means 32, such as one or more buttons, switches, keys, and/or touchpads, etc.

Figure 2:
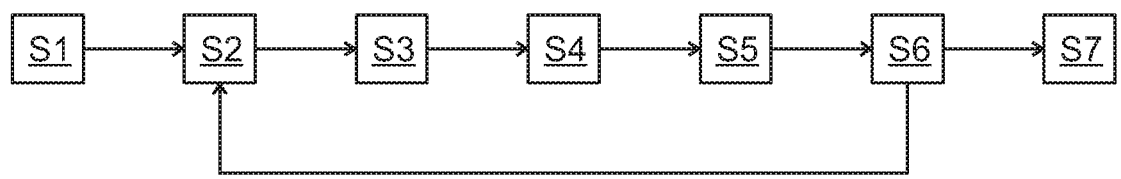
FIG. 2 shows a flow-chart of a representative embodiment of a method according to the disclosure.

Referencing again FIG. 2, the stimulus signal generator 24 is connected to the input 20 of the device under test 12, and the output 22 of the device under test 12 is connected to the measurement unit 26 of the measurement system 14.

For performing a Bode measurement on the device under test 12, the control unit 30 is configured to perform the method shown in FIG. 2.

In a first step S1, the measurement system 14, for example the control unit 30, receives information about the device under test 12. This information is, for example, entered by the user using the display unit 28 or the input means 32. It is of course possible that the information is received electronically from a database or the like.

The information includes at least one input boundary parameter and at least one output boundary parameter. In the shown embodiment, the at least one input boundary parameter is in fact two boundary parameters, being the upper boundary and the lower boundary of the working input range. In the discussed representative case, the input boundary parameters would be −0.1 V and +0.1 V Likewise, the at least one output boundary parameter is for example the upper boundary and the lower boundary of the working output range. In the discussed representative case, the boundaries are 1 V and 4 V.

In the next step S2, the control unit 30 controls the stimulus signal generator 24 to generate a first stimulus signal based on the received input boundary parameters. For example, the stimulus signal generator 24 generates a first stimulus signal lying fully between the upper boundary and the lower boundary of the working input range of the device under test 12. In some embodiments, the first stimulus signal extends over three quarters of the working input range.

In the next step S3, the generated first stimulus signal is fed to the device under test 12, via the input 20 of the device under test 12. After obtaining the first stimulus signal, the device under test 12 processes the first stimulus signal generated in step S4 and, as a response, generates an output signal $O_1$ at the output 22 of the device under test 12.

The output signal $O_1$ is measured by the measurement unit 26, more specifically the measurement unit 26 in a measurement range selected on the basis of the output boundary parameter (step S5). In an example, the measurement range is set between the upper boundary and the lower boundary of the working output range of the device under test 12, e.g., between 1 V and 4 V. Only within this measurement range, the output signal of the device under test 12 is measured.

Figure 3:
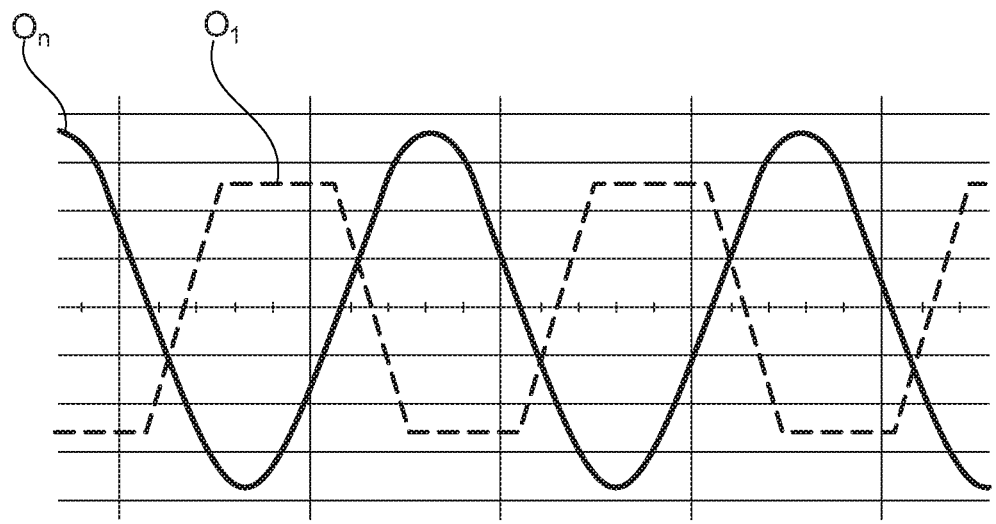
FIG. 3 shows a diagram of two different stimulus signals generated during the method according to FIG. 2.

FIG. 3 shows two exemplary measured output signals, wherein the output signal $O_1$ is the measured output signal measured as a response to the first stimulus signal.

The measurement unit 26 then determines in step S6 whether the measured output signal had been clipped either within the device under test 12 or while measuring in the measurement range. For this purpose, the measurement unit 26 may comprise an evaluation module 34.

The evaluation, whether the measured output signal has been clipped or not is part of the measurement result that may also contain the measured signal or vice versa. The evaluation module 34 comprises software or in hardware or in a combination of hardware and software to carry out the functionality described herein. In one embodiment, the control unit 30 includes a programmed microprocessor or other specially configured computing device. In other embodiments, such functionality can be carried out in analog and/or digital circuitry and associated components.

If it has been determined that the measured output signal is clipped, then a new iteration of measuring the device under test 12 is performed. In other words, the steps S2 to S7 are repeated, however, a new stimulus signal—different from the first stimulus signal—is generated and used for this iteration.

The new stimulus signal is determined by the measurement unit 26, the evaluation module 34, the control unit 30 or the signal generator 24 based on the measurement result and the previous, e.g. the first stimulus signal.

As it has been determined that the measured output signal is clipped, the signal level of the new stimulus signal is reduced, e.g. the amplitude of the new stimulus signal is reduced compared to the previous stimulus signal.

Then, as explained in steps S3, S4 and S5, the new stimulus signal is fed to the device under test 12, which in turn generates a new output signal $O_n$, also shown in FIG. 3. The new output signal $O_n$ is measured and evaluated by the measurement unit 26 to obtain a new measurement result.

If the measured new output signal $O_n$ is also clipped, another iteration of the steps S2 to S5 with another new stimulus signal with a further reduced signal level is performed. However, if the new output signal $O_n$ is not clipped, as can be seen in FIG. 3, the new stimulus signal is used to measure a Bode diagram of the device under test 12 (step S6).

Figure 4:
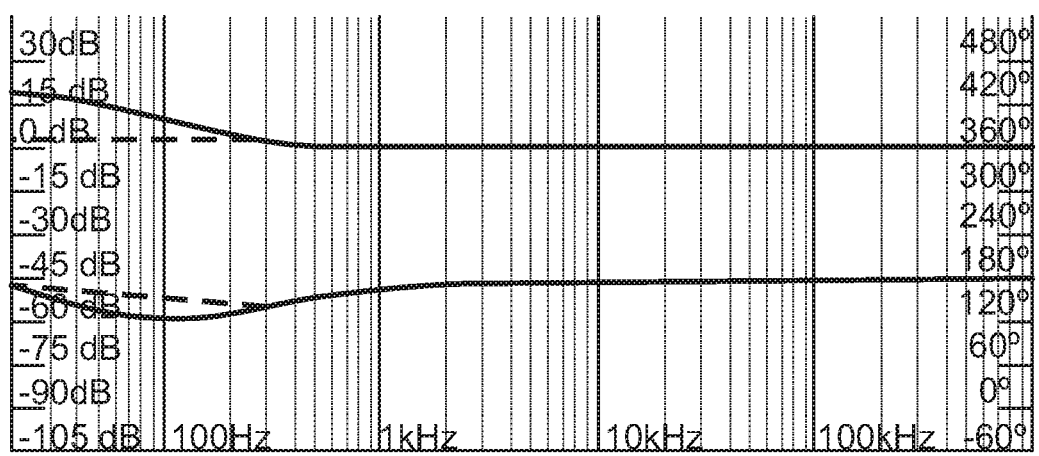
FIG. 4 shows a Bode diagram measured using the method of FIG. 2.

FIG. 4 shows a Bode diagram measured with the new stimulus signal, which does not lead to clipping. In the diagram of FIG. 4, the dashed lines illustrate a Bode diagram that would have been recorded if the first stimulus signal had been used, i.e. the stimulus signal that lead to the clipped output signal $O_1$ (FIG. 3). As can be seen clearly, the Bode diagram would have been inaccurate.

Thus, with the correct Bode diagram of FIG. 4, the transfer function of the device under test 12 has been determined based on the new measured output signal $O_n$ and thus the new measurement result.

During the whole method, the current stimulus signal, the current output signal, the current measurement results and/or the current measured Bode diagram may be displayed using the display unit 28.

In order to further improve the accuracy of the measurement, the measurement unit 26, more specifically the evaluation module 34 may evaluate during step S6 whether the measured output signal $O_1$, $O_n$ extends across a predetermined part of the measurement range, for example three quarters.

If this is the case, the Bode measurement is performed according to step S7. If this is not the case, another iteration of steps S2 to S6 is performed, wherein the new stimulus signal for the next iteration is adjusted, so that the signal level of the new stimulus signal is increased compared to the previous stimulus signal. The increase is, however, lower than the decrease that has been performed in the previous iteration.

Of course, the values and ranges given in this disclosure are only exemplary.

It will be understood that one or more of the measurement unit 26, the display 28, the control unit 30, the evaluation module 34, etc., described above may include, in some embodiments, logic for implementing the technologies and methodologies described herein. This logic of these one or more components can be carried out in either hardware or software, or a combination of hardware and software. In an example, the functionality of one or more of these components could be implemented by special purpose hardware-based computer systems or circuits, etc., or combinations of special purpose hardware and computer instructions. In some embodiments, one or more of these components includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, one or more of these components include a microprocessor and a memory storing logic modules and/or instructions. In an embodiment, one or more of these components include one or more ASICs having a plurality of predefined logic components. In an embodiment, one or more of these components include one or more FPGA having a plurality of programmable logic components. In an embodiment, one or more of these components includes combinations of circuits and computer program products having software or firmware instructions stored on one or more computer readable memories that work together to cause a device to perform one or more methodologies or technologies described herein. In an embodiment, one or more of these components includes hardware circuits (e.g., implementations in analog circuitry, implementations in digital circuitry, and the like, and combinations thereof) for carrying out the functionality described herein.

It will be appreciated that one or more aspects of the methods set forth herein can be carried out in a computer system. In this regard, one or more program elements are provided, which are configured and arranged when executed on a computer for performing a Bode measurement on a device under test. In one embodiment, the one or more program elements may be specifically configured to perform one or more of the following steps: receiving at least one input boundary parameter of said working input range and at least one output boundary parameter of said output working range; generating a first stimulus signal using a stimulus signal generator of said measurement system based on said at least one input boundary parameter; feeding said first stimulus signal to an input of said device under test; and measuring an output signal of said device under test using a measurement unit of said measurement system in a measurement range based on said at least one output boundary parameter obtaining a measurement result. In other embodiments, the one or more program elements may be specifically configured to perform one or more of the steps of claims 2-15.

The one or more program elements may be installed in memory, such as computer readable storage medium. The computer readable storage medium may be any one of the computing devices, modules, instruments, analyzers, etc., described elsewhere herein or another and separate computing device, modules, instruments, analyzers, etc., as may be desirable. The computer readable storage medium and the one or more program elements, which may comprise computer-readable program code portions embodied therein, may further be contained within a non-transitory computer program product.

As mentioned, various embodiments of the present disclosure may be implemented in various ways, including as non-transitory computer program products, computer readable instructions, etc. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, optical disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Other non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM) of any rate, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

The computer-readable media include cooperating or interconnected computer-readable media, which exist exclusively on a processing system or distributed among multiple interconnected processing systems that may be local to, or remote from, the processing system.

In some embodiments, one or more computer-readable storage media is provided containing computer readable instructions embodied thereon that, when executed by one or more computing devices (contained in or associated with the one or more components set forth above), cause the one or more computing devices to perform one or more steps of the methods described herein. In other embodiments, one or more of these method steps can be implemented in digital and/or analog circuitry or the like.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for performing a Bode measurement on a device under test having a specified working input range and a specified working output range using a measurement system, comprising:
   receiving at least one input boundary parameter of said working input range and at least one output boundary parameter of said output working range;
   generating a first stimulus signal using a stimulus signal generator of said measurement system based on said at least one input boundary parameter;
   feeding said first stimulus signal to an input of said device under test; and
   measuring an output signal of said device under test using a measurement unit of said measurement system in a measurement range based on said at least one output boundary parameter obtaining a measurement result,
   wherein a upper boundary of said working input range and a lower boundary of said working input range are received as said at least one input boundary parameter, and the first stimulus signal is generated to be between said upper boundary and said lower boundary of said working input range,
   wherein the upper boundary of said working input range is associated with a maximum voltage applied to the device under test,
   wherein the lower boundary of said working input range is associated with a minimum voltage applied to the device under test, and
   wherein the upper boundary is different from the lower boundary.

2. The method according to claim 1, wherein at least one of said upper boundary and said lower boundary is in the magnitude of millivolts.

3. The method according to claim 1, wherein the upper boundary of said working output range and the lower boundary of said working output range are received as said at least one output boundary parameter and that the output signal is measured between said upper boundary and said lower boundary of said working output range.

4. The method according to claim 3, wherein at least one of said upper boundary and said lower boundary is in the magnitude of volts.

5. The method according to claim 1, wherein said measurement unit determines whether said output signal is clipped.

6. The method according to claim 1, wherein said measurement system comprises an oscilloscope having said measurement unit.

7. The method according to claim 1, wherein said oscilloscope comprises said stimulus signal generator.

8. The method according to claim 1, wherein said device under test is an active device or a passive device.

9. The method according to claim 1, wherein a new stimulus signal is determined based on said measurement result.

10. The method according to claim 9, wherein a signal level of said new stimulus signal is reduced compared to the signal level of said first stimulus signal or the previously used stimulus signal if it has been determined that the output signal is clipped.

11. The method according to claim 9, wherein a signal level of said new stimulus signal is increased compared to the signal level of said first stimulus signal or the previously used stimulus signal if it has been determined that the output signal is not clipped and does not extend over a predetermined portion of the measurement range.

12. The method according to claim 9, wherein a new output signal of said device under test is measured using said new stimulus signal obtaining a new measurement result.

13. The method according to claim 12, wherein a Bode diagram of said device under test is determined based on said new measurement results.

14. The method according to claim 12, wherein the transfer function of the device under test is determined based on said new measurement results.

15. A measurement setup for performing a Bode measurement comprising:
a device under test having a specified working input range and a specified working output range, and
a measurement system having a stimulus signal generator and a measurement unit,
wherein said stimulus signal generator is connected to an input of said device under test and an output of said device under test is connected to said measurement unit, and
wherein said measurement system is configured to:
receive at least one input boundary parameter of said working input range and at least one output boundary parameter of said output working range;
generate a first stimulus signal based on said at least one input boundary parameter using said stimulus signal generator; and
measure an output signal of said device under test using said measurement unit of said measurement system in a measurement range based on said at least one output boundary parameter obtaining a measurement result,
wherein a upper boundary of said working input range and a lower boundary of said working input range are received as said at least one input boundary parameter, wherein the stimulus generator is configured to generate the first stimulus signal to be between said upper boundary and said lower boundary of said working input range,
wherein the upper boundary of said working input range is associated with a maximum voltage applied to the device under test,
wherein the lower boundary of said working input range is associated with a minimum voltage applied to the device under test, and
wherein the upper boundary is different from the lower boundary.

16. The measurement setup according to claim 15, wherein said device under test comprises at least one of an active component and a passive component.

17. The measurement setup according to claim 15, wherein said device under test comprises at least one of an amplifier, an operational amplifier, a quartz filter, a z-diode, a voltage divider and a resistor.

* * * * *